(12) United States Patent
Saito et al.

(10) Patent No.: US 6,639,191 B2
(45) Date of Patent: Oct. 28, 2003

(54) HOT PLATE UNIT

(75) Inventors: Jo Saito, Gifu-ken (JP); Masakazu Furukawa, Gifu-ken (JP); Yasutaka Ito, Gifu-ken (JP)

(73) Assignee: Ibiden Co., Ltd. (JP)

( * ) Notice: Subject to any disclaimer, the term of this patent is extended or adjusted under 35 U.S.C. 154(b) by 0 days.

(21) Appl. No.: 09/880,742

(22) Filed: Jun. 13, 2001

(65) Prior Publication Data
US 2001/0040158 A1 Nov. 15, 2001

Related U.S. Application Data

(63) Continuation of application No. 09/471,759, filed on Dec. 23, 1999.

(30) Foreign Application Priority Data

| Jan. 25, 1999 | (JP) | 11-016163 |
| Feb. 10, 1999 | (JP) | 11-032891 |
| Aug. 9, 1999 | (JP) | 11-225335 |
| Aug. 12, 1999 | (JP) | 11-228457 |
| Aug. 20, 1999 | (JP) | 11-234171 |

(51) Int. Cl.⁷ ............................... H05B 3/68
(52) U.S. Cl. ............................... 219/452.11
(58) Field of Search ............... 219/452.11, 452.12, 219/444.1, 537, 450.1, 451.1, 456.1, 460.1, 461.1, 465.1, 466.1, 467.1

(56) References Cited

U.S. PATENT DOCUMENTS

| 2,563,875 A | 8/1951 | Salton |
| 2,715,173 A | 8/1955 | Farquharson |
| 3,717,439 A | 2/1973 | Sakai |
| 3,997,760 A | 12/1976 | Salinger |
| 4,453,533 A | 6/1984 | Scheidler et al. |
| 4,525,375 A | 6/1985 | Hanak |
| 4,960,978 A | 10/1990 | Lorenz et al. |
| 5,026,970 A | 6/1991 | Buttery |
| H1145 H | 3/1993 | Anderson |
| 5,306,895 A | 4/1994 | Ushikoshi et al. |
| 5,317,129 A * | 5/1994 | Taplan et al. ......... 219/452.11 |
| 5,399,839 A | 3/1995 | Taplan et al. |
| 5,490,228 A | 2/1996 | Soma et al. |
| 5,683,606 A | 11/1997 | Ushikoshi et al. |
| 5,891,538 A | 4/1999 | Yamamoto et al. |
| 5,904,872 A | 5/1999 | Arami et al. |
| 6,034,863 A | 3/2000 | Marohl et al. |
| 6,359,264 B1 | 3/2002 | Schaper et al. |

FOREIGN PATENT DOCUMENTS

| EP | 0 467 397 | 1/1992 |
| JP | 62-14489 | 1/1987 |
| JP | 62-169330 | 7/1987 |
| JP | 63-149089 A | 9/1988 |
| JP | 4087178 | 3/1992 |
| JP | 04181724 | 6/1992 |
| JP | 6037039 | 2/1994 |
| JP | 6069326 | 3/1994 |
| JP | 7130830 | 5/1995 |
| JP | 8-315965 A | 11/1996 |
| JP | 9-017849 A | 1/1997 |
| JP | 9-167794 | 6/1997 |
| JP | 10-284382 | 10/1998 |
| JP | 10-312943 | 11/1998 |
| JP | 2001118789 | 4/2001 |
| WO | WO 98/12482 A1 | 3/1998 |

* cited by examiner

*Primary Examiner*—Sang Paik
(74) *Attorney, Agent, or Firm*—Akerman Senterfitt

(57) ABSTRACT

A hot plate unit for heating semiconductor wafers. The hot plate unit includes a case, a hot plate, a seal element, and a holding ring. The seal element is made of a heat insulative material and is arranged between the case and the hot plate. The hot plate is clamped between the holding ring and the seal element. Screws for fastening the holding ring do not contact the hot plate.

12 Claims, 9 Drawing Sheets

HOT PLATE UNIT

CROSS REFERENCES TO RELATED APPLICATIONS

This application is a continuation of (and incorporates by reference) patent application Ser. No. 09/471,759 filed Dec. 23, 1999 and entitled "HOT PLATE UNIT."

BACKGROUND OF THE INVENTION

The present invention relates to a hot plate unit, and more particularly, to a hot plate unit for heating a silicon wafer during a semiconductor manufacturing process.

In a semiconductor manufacturing process, a hot plate unit is normally used to dry photosensitive resin, which is applied to silicon wafers. The hot plate unit is incorporated in a semiconductor manufacturing apparatus.

Japanese Examined Patent Publication 4-13873 describes a first example of a prior art hot plate unit. The hot plate unit includes a hot plate, which is made of an aluminum nitride sintered body, and a resistor arranged in the plate. The two ends of the resistor project from the sides of the plate and are connected to a power supply via wires.

A silicon wafer, which is the heating subject, is placed on the hot plate. When the resistor is supplied with current, the resistor is heated for a predetermined time period to heat the silicon wafer and dry the photosensitive resin. The flow of current is then stopped to gradually cool the hot plate and the silicon wafer. After the hot plate and the silicon wafer are cooled to a relatively low temperature, the silicon wafer is removed from the hot plate to undergo the next process. Since the time period for cooling the hot plate is relatively long, it is difficult to improve productivity.

To decrease the cooling time of the hot plate, the plate may be cooled by, for example, forcing cooling air against the lower surface of the hot plate. However, the moisture and dust in the forced air may contaminate the semiconductor manufacturing apparatus and its environment.

Japanese Examined Patent Publication No. 8-8246 describes a second example of a prior art hot plate. The hot plate includes a cooling body provided with cooling fins. However, although the cooling body cools the hot plate locally, the hot plate cannot be cooled entirely.

FIG. 1 shows a third example of a prior art hot plate unit 41. The hot plate unit 41 includes a cup-like casing 42 and a hot plate 43 made of a ceramic sintered body. The casing 42 is made of a metal material, such as aluminum, and has a lip 44 located at its upper portion. The casing 42 has an opening encompassed by the lip 44. Resistors 45 are arranged in a predetermined pattern at the lower surface of the hot plate 43. A plurality of screw holes 46 extend through the peripheral portion of the hot plate 43. A plurality of threaded holes 47 extend through the lip 44. The screw holes 46 of the hot plate 43 are aligned with the threaded holes 47 of the lip 44. A screw 48 is inserted into each set of aligned holes 46, 47 to fasten the hot plate 43 to the casing 42.

The hot plate unit 41 uses fasteners, such as the screws 48, to fasten the hot plate 43 directly to the metal casing 42. Thus, the heat of the hot plate 43 is transmitted to the casing 42 through the screws 48. As a result, the temperature at the periphery of the hot plate 43 tends to be lower. Furthermore, the hot plate 43 cannot be cooled in a uniform manner.

In addition, the fastening force of the screws 48 may damage the hot plate 43 since the force is applied directly to the hot plate 43. Further, it is difficult to machine threaded holes in the hot plate 43, which is made of a hard material.

SUMMARY OF THE INVENTION

Accordingly, it is a first object of the present invention to provide a hot plate unit that adjusts the temperature of a heating subject in a uniform manner. It is a second object of the present invention to provide a hot plate unit that is easily secured to a supporting body.

To achieve the above objects, the present invention provides a hot plate unit including a case and a hot plate having a heat generator. The case and the hot plate define a space in which a fluid flows.

Another aspect of the present invention provides a hot plate unit including a case having a lip, a hot plate having a heat generator, and a holder for securing the hot plate to the case. The hot plate is made of sintered ceramic. The holder contacts a peripheral portion of the upper surface of the hot plate when the holder is fixed to the case.

Further aspect of the present invention provides a hot plate unit including a case having a lip, a hot plate having a heat generator, and a seal element. The hot plate is made of sintered ceramic. The hot plate is secured to the case via the seal element. The seal element is heat insulative.

Further aspect of the present invention provides a hot plate unit including a case having a lip, a hot plate having a heat generator, and at least one intake port extending through the case.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A hot plate unit 1 according to a first embodiment of the present invention will now be described with reference to FIGS. 2 to 4.

Figure 1:
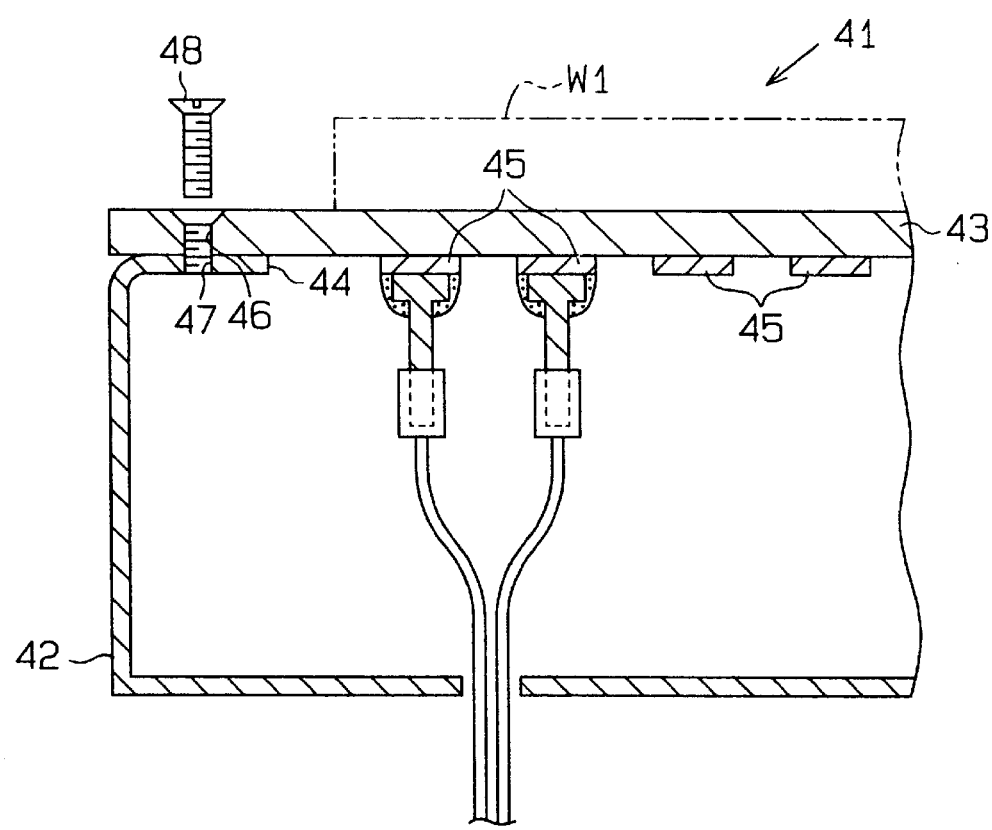
FIG. 1 is a cross-sectional view partially showing a prior art hot plate unit.
Figure 2:
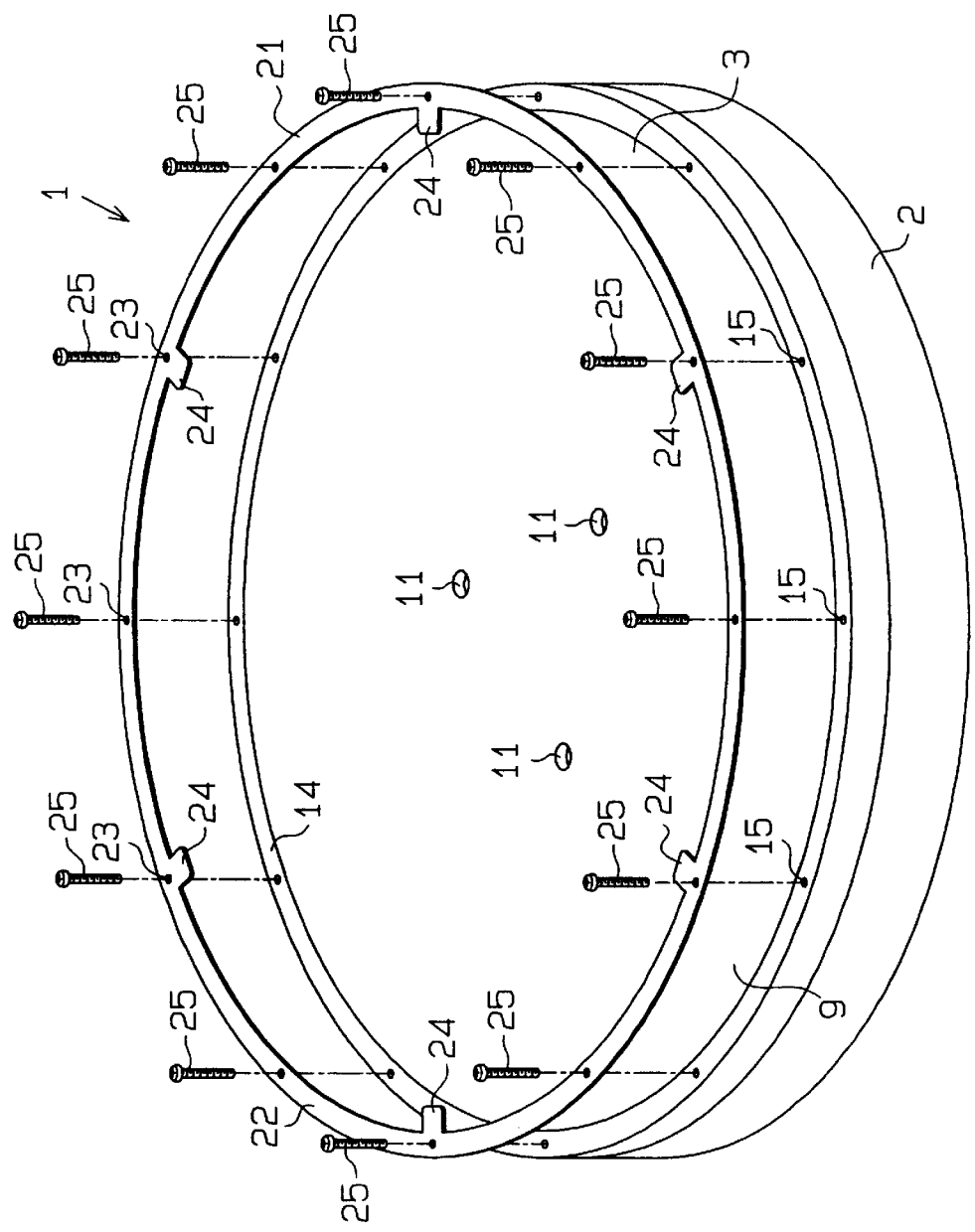
FIG. 2 is an exploded perspective view showing a hot plate unit according to a first embodiment of the present invention.
Figure 3:
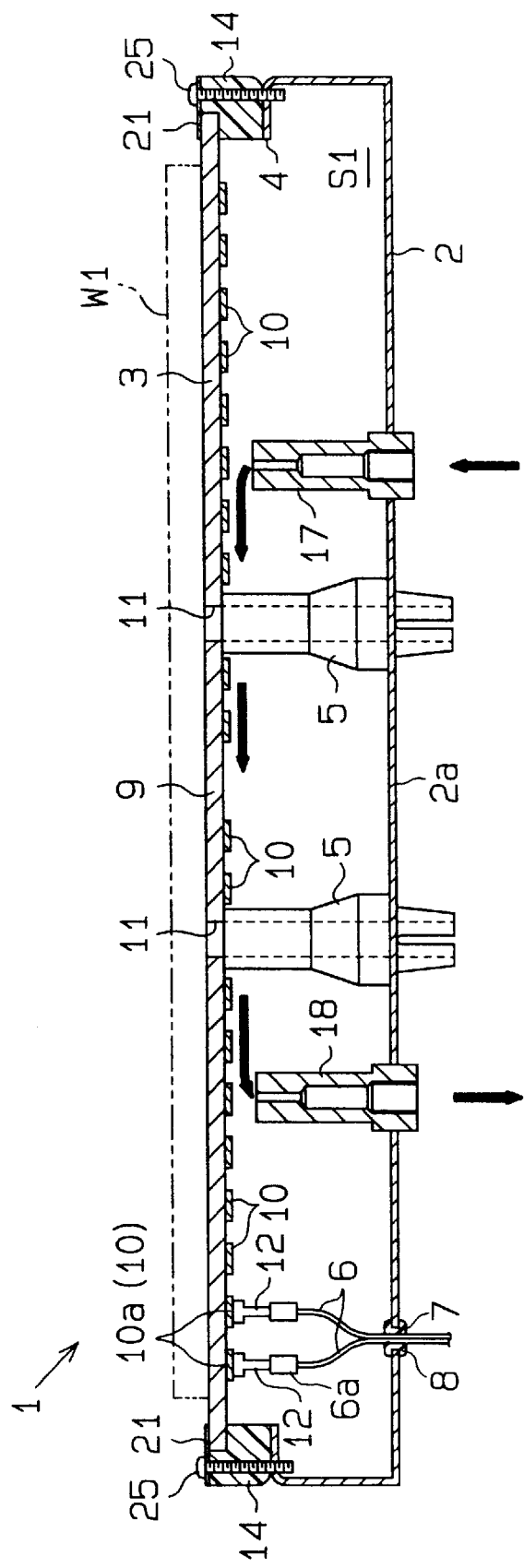
FIG. 3 is a cross-sectional view showing the hot plate unit of FIG. 2.
Figure 4:
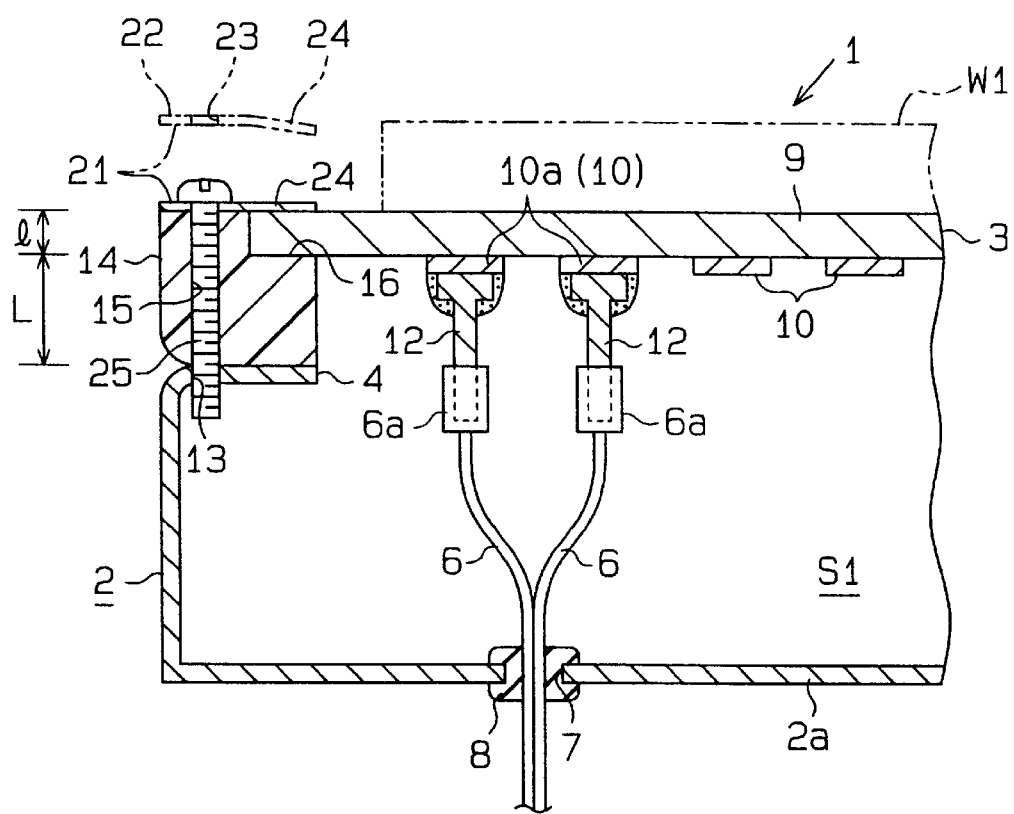
FIG. 4 is an enlarged cross-sectional view showing the periphery of the hot plate unit of FIG. 3.

As shown in FIGS. 2 to 4, the hot plate unit 1 includes a hot plate 3 and a metal (e.g., aluminum) case 2. The case 2 has a bottom wall 2a and a lip 4. Three guide sleeves 5 (only two shown) are arranged at the central portion of the bottom wall 2a. A lift pin (not shown) is inserted into each of the three lift pin holes 11. The three lift pins support a silicon wafer W1 at three points and lift the silicon wafer W1 to a predetermined height from the upper surface of the hot plate 3. A lead wire hole 7 extends through a peripheral portion of the bottom wall 2a. Lead wires 6 for supplying current to the hot plate 3 extend from the case 2 through the lead wire hole 7.

The hot plate 3 includes a base plate 9 made of a ceramic sintered body and a heat generator 10 formed on the base plate 9. In this embodiment, the heat generator 10 is a resistor that is formed in a predetermined pattern. The pattern is arranged for uniformly heating the entire base plate 9. The pattern is preferably one of concentric circles or a spiral. A silicon wafer W1, to which a photosensitive resin has been applied, is placed on the hot plate 3 and heated to a predetermined temperature (e.g., 200° C. to 300° C.) to dry the photosensitive resin. As shown in FIG. 2, the case 2 and the base plate 9 are both circular. The diameter of the base plate 9 is slightly smaller than that of the case 2. The base plate 9 is secured to the top of the lip 4 with an attachment or a seal element 14. Three lift pin holes 11 extend through the central portion of the hot plate 3. With reference to FIG. 4, the thickness 1 of the base plate 9 is preferably three millimeters but may be changed to an arbitrary thickness within a range of one to ten millimeters.

A nitride ceramic sintered body having superior heat resistance and high heat conductivity may be used as the material of the base plate 9. A preferred nitride ceramic body is a ceramic sintered body made of a metal nitride, such as aluminum nitride, silicon nitride, boron nitride, or titanium nitride. A ceramic sintered body made of a metal carbide, such as silicon carbide, zirconium carbide, titanium carbide, tantalum carbide, or tungsten carbide, may also be used. Among these materials, aluminum nitride has the highest heat conductivity and is thus especially preferred as the material forming the ceramic sintered body.

The heat generator 10 is formed by printing a conductive paste on the base plate 9. The conductive paste includes metal particles, metal oxides, resin, and a solvent. It is preferred that the metal particles resist oxidation at high temperatures and have a high resistance so that sufficient heat is produced when a current is passed through the heat generator 10. For example, gold, silver, platinum, palladium, copper, tungsten, and nickel may be used. Metal oxides (e.g., lead oxide, zinc oxide, silica, boron oxide, alumina, yttria, or titania) may also be used.

As shown in FIG. 4, two pads 10a, which serve as external connection terminals, are connected to one end of the heat generator 10. A terminal pin 12 made of a conductive material is soldered to each pad 10a. A socket 6a, which is attached to the distal end of each lead wire 6, is connected to each terminal pin 12. Current is supplied to the heat generator 10 via the lead wires 6 and the terminal pins 12.

Referring to FIG. 4, a plurality of equally spaced threaded holes 13 extend through the lip 4. An elastic seal element 14 is arranged on the lip 4 to seal the space between the case 2 and the hot plate 3. A threaded bore 15 extends through the seal element 14 in correspondence with each threaded hole 13 of the lip 4. A step 16 extends along the inner surface of the annular seal element 14 to horizontally support the hot plate 3. When the hot plate 3 is supported on the step 16, the top surface of the seal element 14 is flush with the upper surface of the hot plate 3.

The dimension L between the step 16 and the lower surface of the seal element 14 is preferably seven millimeters but may be changed arbitrarily within a range of one to ten millimeters. The depth from the top surface of the seal element 14 to the step 16 is three millimeters to correspond with the thickness 1 of the base plate 9. The depth is changed in accordance with the thickness 1 of the base plate 9.

An intake port 17 and a discharge port 18 each extend through the bottom wall 2a of the case 2. Air is sent through the intake port 17 into a space S1 defined in the case 2. The air is discharged externally from the space S1 through the discharge port 18. The intake and discharge ports 17, 18 are separated from each other by a predetermined distance.

The internal surface of the inlet of the intake port 17 is threaded in order to receive a cooling air supply pipe (not shown), which is connected to a fluid pump (not shown). The pump sends air, which serves as a cooling fluid, into the space S1 through the supply pipe. The internal surface of the outlet of the discharge port 18 is threaded in order to receive an air discharge pipe (not shown). The cooling air in the space S1 is discharged through the discharge pipe to a separate location.

With reference to FIG. 3, a packing 8 is fitted to the lead wire hole 7. The packing 8 is annular and made of an elastic material such as rubber. The lead wires 6 extend out of the case 2 through the hollow portion of the packing 8. The packing 8 seals the space between the lead wires 6 and the lead wire hole 7.

The hot plate unit 1 includes a holding frame, or holding ring 21, which serves as a holder. The holding ring 21 includes a ring body 22 and a plurality of projections 24 (six in the first embodiment). In this embodiment, the projections 24 are planar tabs. The ring body 22 is made of spring steel and has a dimension corresponding to that of the lip 4. A plurality of equally spaced screw holes 23 extend through the ring body 22. The screw holes 23 of the holding ring 21 are formed in correspondence with the threaded bores 15 of the seal element 14. The projections 24 contact the upper surface of the hot plate 3 and project inward from the ring body 22. As shown by the broken line in FIG. 4, each of the projections 24 is inclined relative to the ring body 22 towards the bottom surface of the holding ring 21. The holding ring 21 can be produced in a relatively simple manner by, for example, punching a sheet of spring steel having a thickness of one to three millimeters into the predetermined shape.

The process for installing the hot plate 3 will now be described. Before installing the hot plate 3, the terminal pins 12 are soldered to the pads 10a, and the lead wire sockets 6a are connected to the terminal pins 12. The lead wires 6 are extended from the case through the lead wire hole 7.

The seal element 14 is then arranged on the lip 4 of the case 2. The peripheral portion of the hot plate 3 is placed on the step 16. The holding ring 21 is arranged on the top surface of the seal element 14. The corresponding screw holes 23 of the holding ring 21, the threaded bores 15 of the seal element 14, and the threaded holes 13 are aligned with one another. The screws 25 are inserted into the aligned holes and bores 13, 15, 23 to fasten the holding ring 21, the seal element 14, and the lip 4 to one another. As a result, the projections 24 are elastically deformed when they contact the hot plate 3. The hot plate 3 is pressed against the step 16 by the projections 24 and clamped between the projections 24 and the seal element 14 (the upper surface of the step 16).

This fixes the hot plate 3 to the case 2 by way of the seal element 14. The holding ring 21, the hot plate 3, and the case 2 are fixed to one another. Accordingly, the screws 25 serve to fasten the seal element 14 to the case 2 and the holding ring 21 to the case 2.

The method for using the hot plate unit 1 will now be described. The silicon wafer W1, to which a photosensitive resin is applied, is placed on the hot plate 3. Current is then supplied to the heat generator 10. As the temperature of the hot plate 3 increases, the silicon wafer W1 is heated. Heating over a predetermined time dries the photosensitive resin. The flow of current to the heat generator (resistor) 10 is then stopped.

In this state, the fluid pump is driven to send cooling air into the space S1 through the intake port 17. The flow of the cooling air is shown schematically by the arrows in FIG. 3. As the cooling air flows toward the discharge port 18, the air contacts the lower surface of the hot plate 3 in the space S1. Heat is exchanged between the hot plate 3 and the cooling air that contacts the hot plate 3. The heated air flows through the discharge port 18 and out of the space S1 to a location where contamination is not a problem. When the hot plate 3 is cooled to a certain temperature, the silicon wafer W1 is removed from the hot plate 3.

The first embodiment has the advantages described below.

(1) The hot plate 3 is cooled by forcing cooling air into the space S1 between the case 2 and the hot plate 3. Accordingly, the time required for cooling is decreased in comparison to spontaneous cooling. Thus, the hot plate unit 1 decreases the drying time and improves productivity. Furthermore, leakage of air into the environment of the hot plate unit 1 is substantially prevented. Hence, the semiconductor manufacturing apparatus incorporating the hot plate unit 1 and its environment are not contaminated.

(2) In the first embodiment, the cooling air is efficiently circulated through the intake port 17 and the discharge port 18. That is, the forced cooling air cools the hot plate 3 in the space S1 and returns the temperature to a low value within a relatively short time.

(3) In the hot plate unit 1, the space between the lip 4 and the lower peripheral surface of the hot plate 3 is sealed by the seal element 14. Thus, air does not leak between the lip 4 and the hot plate 3. This ensures that the ambient environment of the hot plate unit 1 is prevented from being contaminated.

(4) In the hot plate unit 1, the substantially sealed space S1 is defined between the case 2 and the hot plate 3. Projections such as the terminal pins 12 are provided at the lower surface of the hot plate 3. However, these projections are located in the space S1. In other words, the projections are protected by the case 2 and are not exposed externally from the hot plate unit 1. Accordingly, the bottom surface of the case 2 can easily be attached to a support stage (not shown).

(5) In the hot plate unit 1, the ring packing 8 at the lead wire hole 7 is arranged in the bottom wall 2a, and the lead wires 6 are inserted through the packing 8. Accordingly, air is prevented from leaking out of the apparatus through the lead wire hole 7. This prevents contamination of the environment of the apparatus.

(6) In the hot plate unit 1 of the first embodiment, the hot plate 3 is attached to the case 2 using the holding ring 21. Thus, screw holes need not be provided in the periphery of the hot plate 3. That is, when the hot plate 3 is manufactured, holes need not be machined into the hard ceramic sintered body. This facilitates production of the hot plate unit 1 and decreases the production cost of the hot plate unit 1.

(7) Although the hot plate 3 is fastened by fasteners, such as the screws 25, the seal element 14 arranged between the hot plate 3 and the case 2 absorbs the fastening force applied to the hot plate 3. Thus, the fastening force does not damage the hot plate 3.

(8) The hot plate 3 is clamped between the seal element 14 and the holding ring 21. Thus, the hot plate 3 is fixed to the case 2 and is prevented from being loosened.

(9) The holding ring 21 used in the first embodiment includes the ring body 22, which is made of a spring steel and has a diameter substantially equal to that of the lip 4, and the projections 24, which are spaced apart from one another. Accordingly, the projections 24 contact the hot plate 3 at different locations. In this state, an acceptable spring force acts on the projections 24 and securely fixes the hot plate 3 to the lip 4 of the case 2.

(10) The hot plate 3 is fastened by a single holding ring 21. Thus, the number of components is decreased in comparison to when using a plurality of holders. Accordingly, the assembly of the hot plate 3 is facilitated.

Second to seventh embodiments according to the present invention will now be described. The description centers on parts differing from the first embodiment. To avoid redundancy, like or same reference numerals are given to those components that are the same as the corresponding components of the first embodiment.

Figure 5:
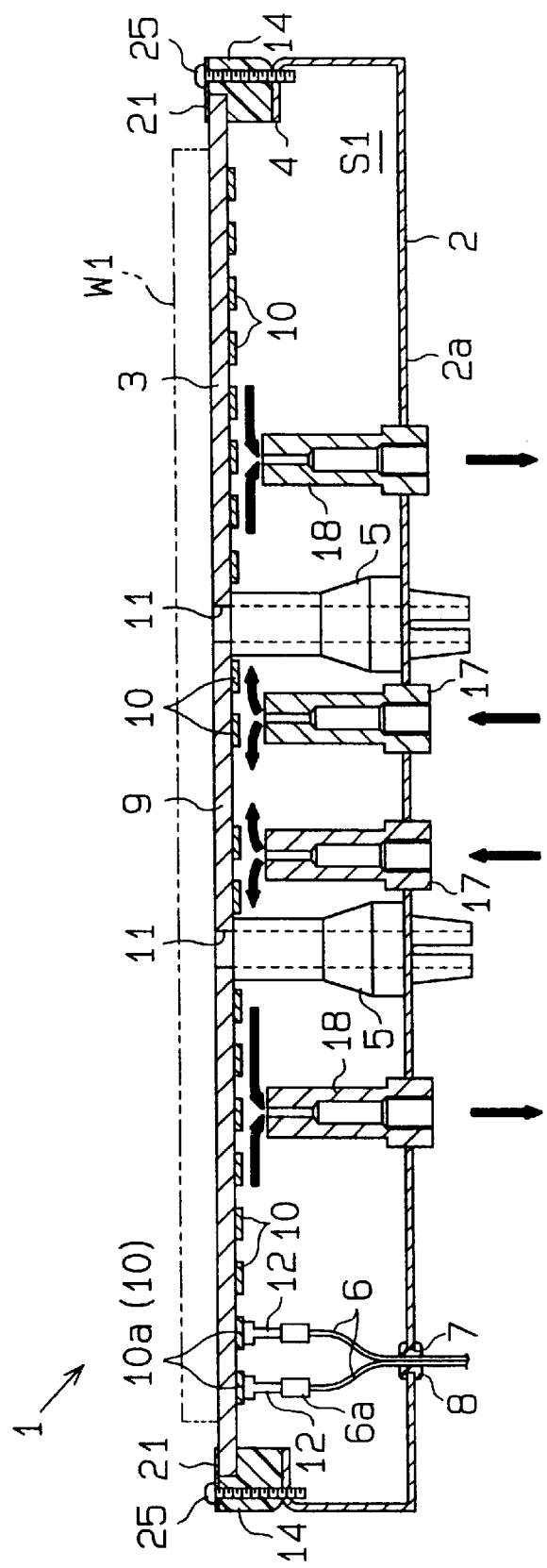
FIG. 5 is a cross-sectional view showing a hot plate unit according to a second embodiment of the present invention.

As shown in FIG. 5, two intake ports 17 and two discharge ports 18 are respectively defined in four sleeves fastened to the bottom wall 2a of the case 2. The two intake ports 17 are located at the central portion of the bottom wall 2a. The discharge ports 18 are located outward from the intake ports 17.

When the cooling air is sent into the space S1 through the intake port 17 from the fluid pump (not shown), the air is directed vertically against the lower surface of the hot plate 3. The flow of air is schematically shown by the arrows in FIG. 5. The air is heated by the entire hot plate 3 in a substantially uniform manner. The heated air flows out through the discharge ports 18 to a location where contamination is no longer a problem.

In addition to the advantages of the first embodiment, the second embodiment has the advantages described below.

(11) The hot plate unit 1 has two intake ports 17 at the bottom wall 2a of the case 2. This structure improves the circulation of the cooling air in the space S1. The time required to cool the hot plate 3, with air that contacts the lower surface of the hot plate 3 is further decreased. Accordingly, the entire hot plate 3 is cooled within a short period of time.

(12) The intake ports 17 are located at the bottom wall 2a of the case 2. Thus, the air that flows into the case 2 through the intake ports 17 is directed vertically against the lower surface of the hot plate 3. This cools the hot plate 3 within a relatively short period of time.

(13) The two intake ports 17 cause the cooling air to contact the entire hot plate 3. Thus, the hot plate 3 is cooled in a uniform manner.

Figure 6:
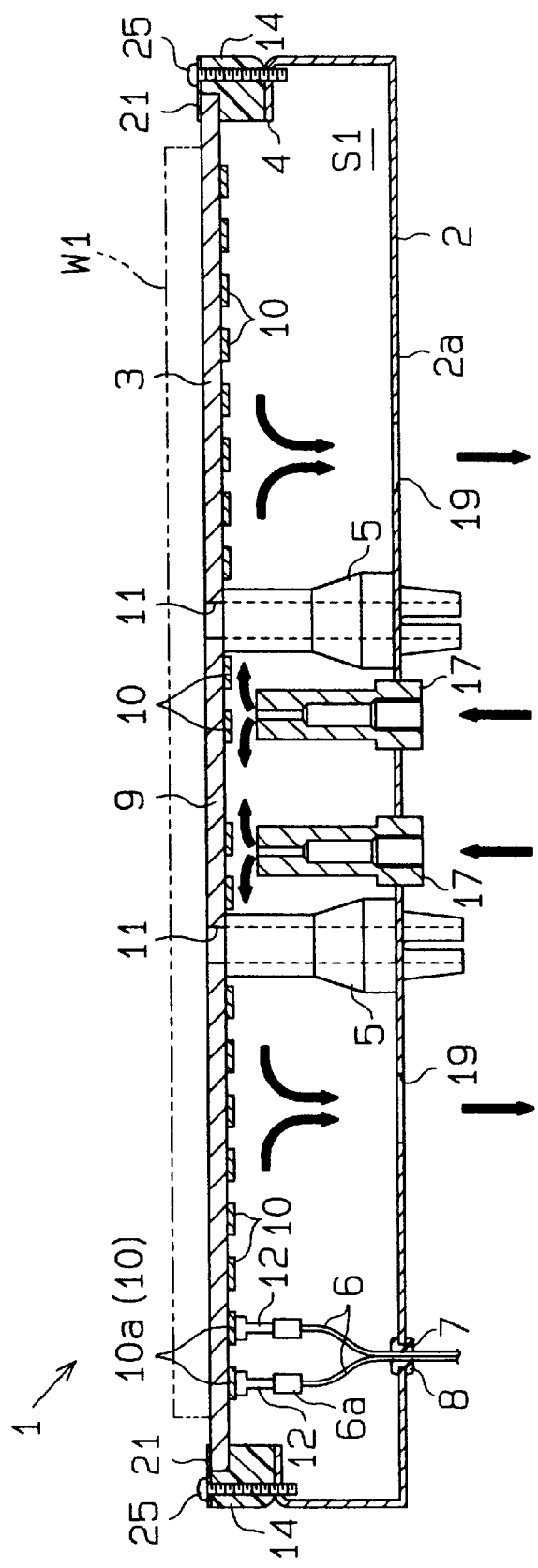
FIG. 6 is a cross-sectional view showing a hot plate unit according to a third embodiment of the present invention.

A hot plate unit 1 according to a third embodiment of the present invention will now be described with reference to FIG. 6. As shown in FIG. 6, the hot plate unit 1 of the third embodiment does not have the discharge ports 18 of the second embodiment. A plurality of apertures 19 are formed in lieu of the discharge ports 18 in the bottom wall 2a. The simplified structure of the hot plate unit 1 of FIG. 6 saves production costs.

Figure 7A:
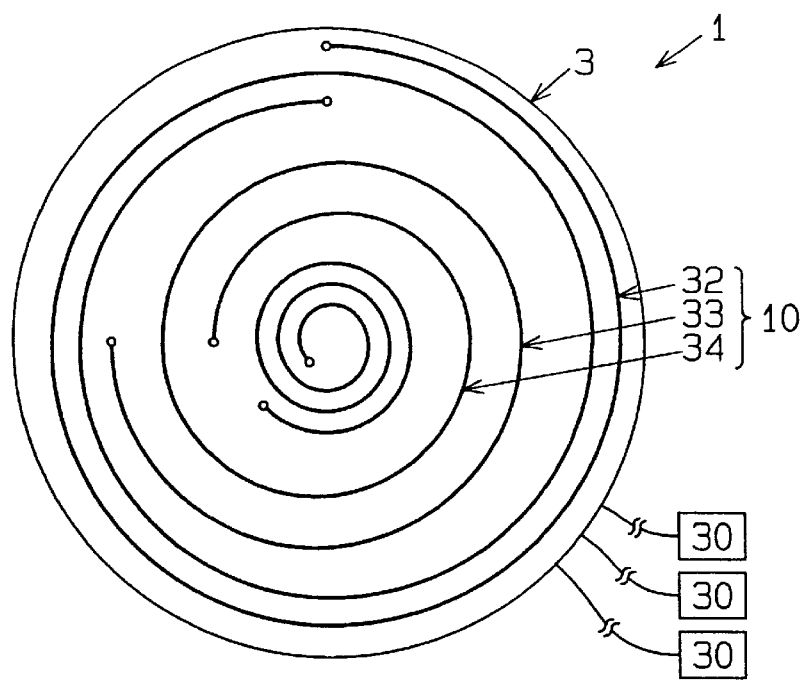
FIG. 7(a) is a plan view showing a resistor pattern formed in a hot plate unit according to a fourth embodiment of the present invention.

A hot plate unit 1 according to a fourth embodiment of the present invention will now be described. As shown in FIG. 7(a), the heat generator 10 includes three resistors 32–34. Three heating circuits 30 are provided to heat the three-part heat generator 10. The three heating circuits 30 independently supply the associated resistor 32–34 with power. In this case, as shown by the diagonal lines in FIG. 7(b), three heat zones A1–A3 are defined in the hot plate 3.

Figure 7B:
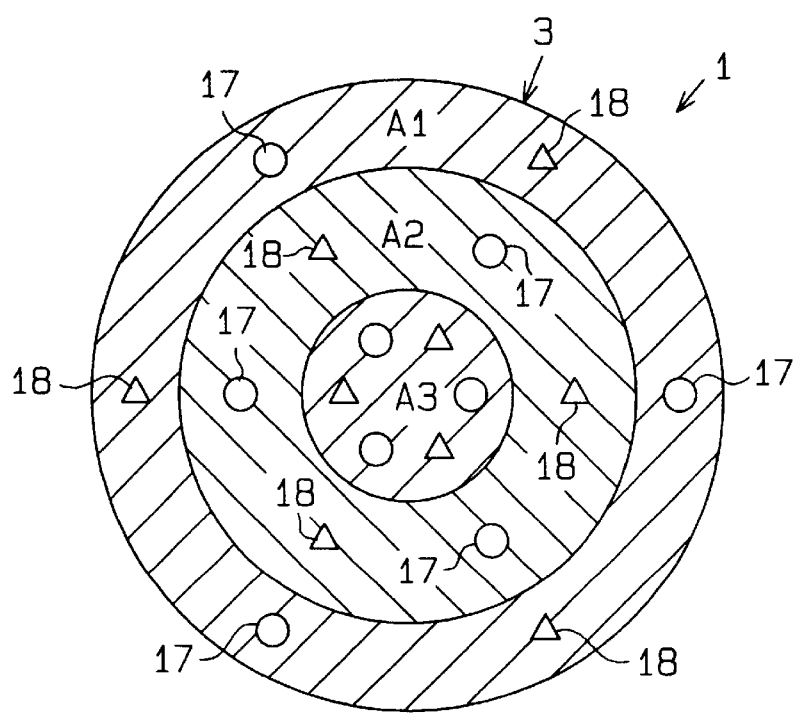
FIG. 7(b) is a plan view showing the locations of a intake port and a discharge port in the hot plate unit of FIG. 7(a)

Referring to FIG. 7(b), a plurality of intake ports 17 (three in the fourth embodiment) are arranged in each heat zone A1–A3, as indicated by the circles. A plurality of discharge ports 18 (three in the fourth embodiment) are also arranged in each heat zone A1–A3, as indicated by the triangles. The three intake ports 17 and the three discharge ports 18 in each heat zone A1–A3 are equally spaced from one another. More specifically, the three intake ports 17 are located at the corners of a right triangle, and the three discharge ports 18 are located at the corners of another right triangle.

A hot plate unit 1 according to a fifth embodiment of the present invention will now be described.

The fifth embodiment differs from the first embodiment in that the seal element 14 is made of a heat insulating material. Otherwise, the hot plate unit 1 of the fifth embodiment has the same appearance as the hot plate unit 1 of FIGS. 2 to 4.

The seal element 14 may be made of, for example, an inorganic fiber heat insulating material, such as ceramic fiber or glass wool, a porous resin, such as foam urethane resin or foam styrene resin, or fluororesin. However, it is preferred that the seal element 14 be made of a ceramic fiber solidified by an inorganic binder since the heat conductivity is low. More specifically, it is preferred that the seal element 14 be made of a ceramic fiber, such as IBI WOOL (available from IBIDEN CO., LTD.), that is solidified by silica gel or alumina sol.

When fluororesin is used to form the seal element 14, the seal element 14 has superior heat resisting, insulating, and flame-resisting properties. Fluororesin is used in a temperature range that is wider than general-purpose synthetic resins and thus is heat resistant. Fluororesin also has a small dielectric loss and is thus a good insulator. Furthermore, fluororesin does not burn in air or in a gas where the oxygen concentration is 95% or less and thus has good flame-resistance. The preferred fluororesins are polytetrafluoroethylene resin (PTFE), tetrafluoroethyleneperfluoroalkylvinylether copolymer (PFA), fluorinated ethylene propylene copolymer resin (FEP), ethylene tetrafluoro ethylene resin (ETFE), polyvinylidene fluoride (PVDF), and ethylene chloride trifluoride (PCTFE).

In addition to the advantages of the first embodiment, the fifth embodiment has the advantages described below.

(14) In the fifth embodiment, the hot plate 3 is fastened to the case 2 by way of the heat insulative seal element 14. This suppresses the transfer of heat from the hot plate 3 to the case 2, especially at the periphery of the hot plate 3. Accordingly, the hot plate unit 1 heats the silicon wafer W1 in a uniform manner since high temperatures at the periphery of the hot plate 3 can be suppressed.

(15) Fluororesin is one of the materials used to form the seal element 14. This improves the heat and flame resistance and the insulative characteristics of the seal element 14.

Figure 8:
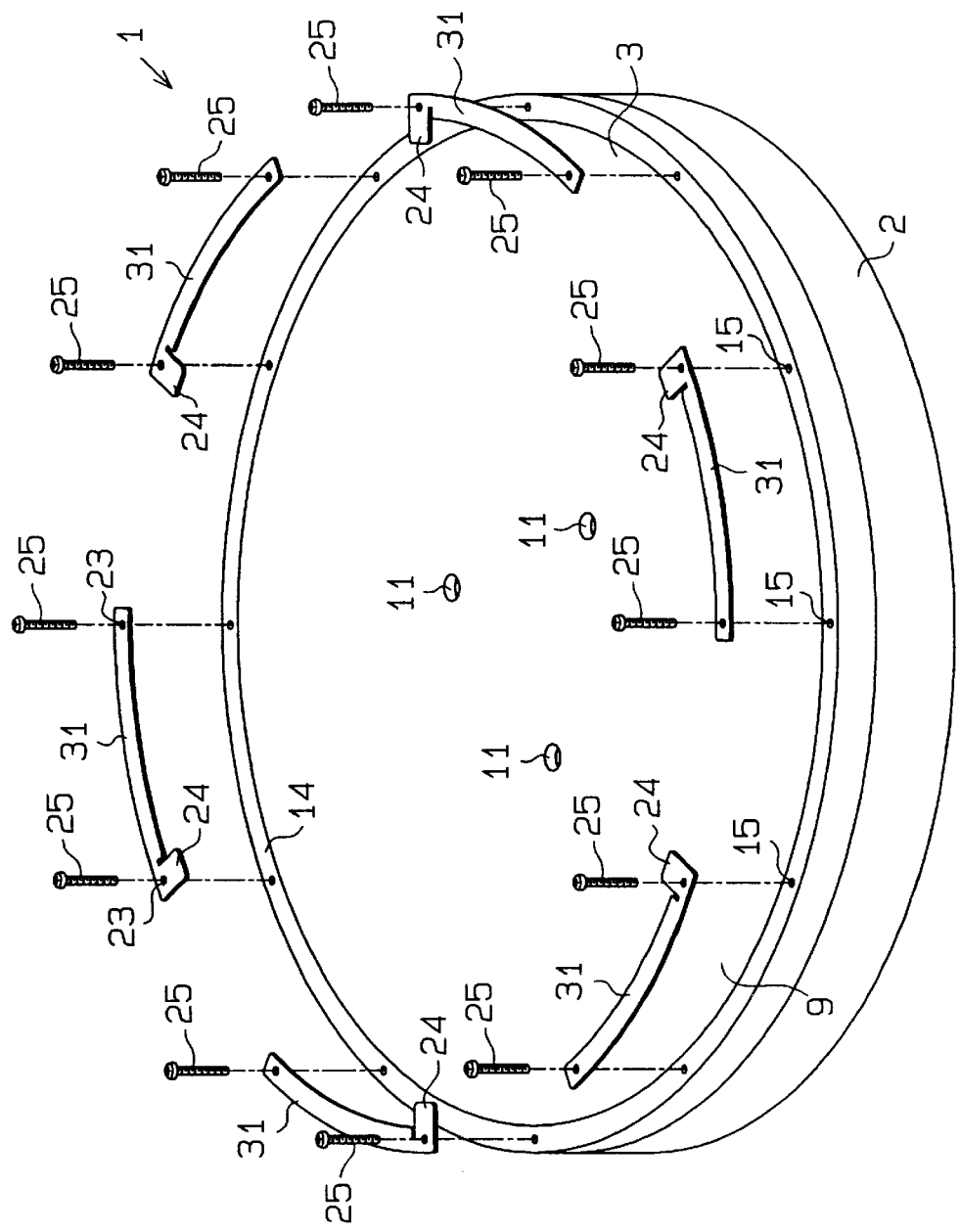
FIG. 8 is an exploded perspective view showing a hot plate unit according to a sixth embodiment of the present invention.

A hot plate unit 1 according to a sixth embodiment of the present invention will now be described with reference to FIG. 8.

In the hot plate unit 1 of the sixth embodiment, a plurality of holding plates 31 (six in this embodiment) are used in lieu of the holding ring 21 of the fifth embodiment. Each holding plate 31 is arcuate and is formed as if it were cut from the holding ring 21.

Each holding plate 31 is made of spring steel and has a length that is a fraction of the circumference of the lip 4 (the circumference of the hot plate 3). In the embodiment of FIG. 8, the circumferential length of each holding plate is approximately one twelfth of the circumference of the holding ring 21. Screw holes 23 are formed at each end of the holding plates 31. The projections 24 are each formed at one end of each holding plate 31. The holding plates 31 are equally spaced from one another, and the six projections 24, or tabs, press the upper surface of the hot plate 3.

Accordingly, in addition to the advantages of the fifth embodiment, the sixth embodiment has the advantages described below.

(16) In the sixth embodiment, the six holding plates 31 are used to fasten the hot plate 3. The spring force of the projections 24 of the holding plates 31 is used to clamp the seal element 14 between the lip 4 of the case 2 and the projections 24.

(17) Since the holding plates 31 have a relatively short length, deformation of the plates 31, due to mishandling or other reasons, seldom occurs. Accordingly, the usage of the plurality of holding plates 31 to fasten the hot plate 3 maintains the elastic force of the projections 24 at an appropriate level.

Each of the above embodiments may be modified as described below.

Figure 9:
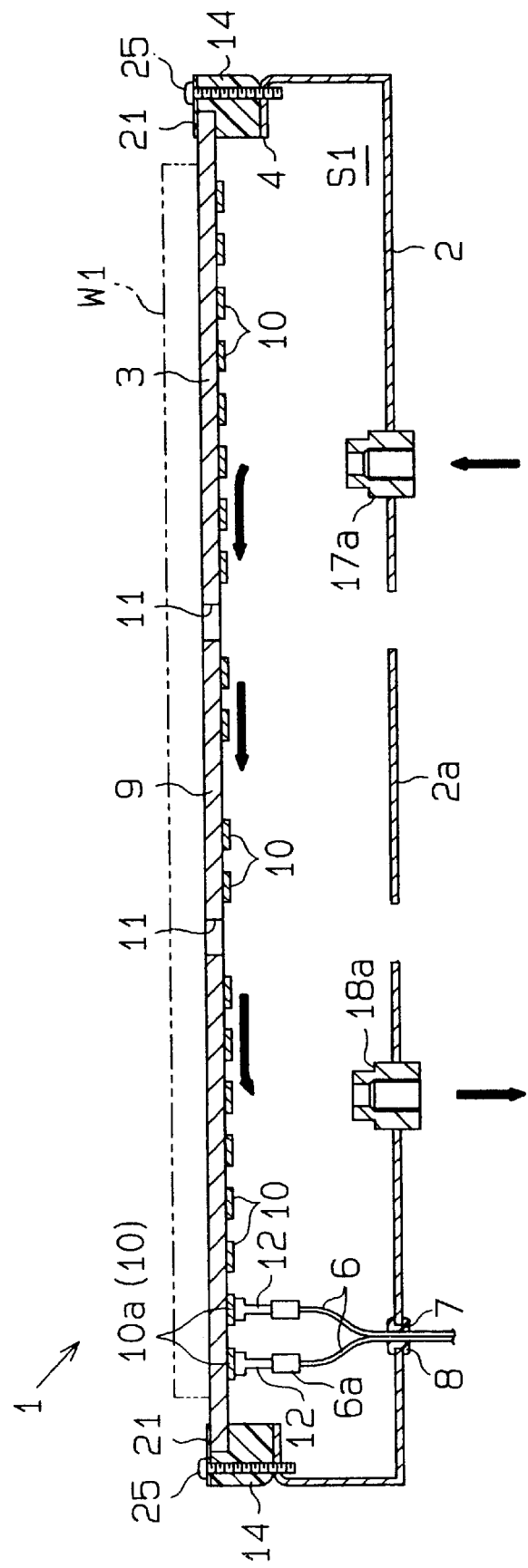
FIG. 9 is a cross-sectional view showing a hot plate unit according to another example of the present invention.

As shown in FIG. 9, a short intake port 17a and a short discharge port 18a can be provided instead of the intake port 17 and the discharge port 18 in the first to sixth embodiments. In this case, a fluid flown through the intake port 17a contacts the hot plate 3 at relatively broader area. Accordingly, the hot plate 3 is cooled more uniformly.

As shown in FIG. 9, the guide sleeves 5 in the first to sixth embodiments may be omitted.

The number of projections 24 in the first to sixth embodiments may be changed arbitrarily.

The shape and number of the engaging holding plates 31 in the sixth embodiment may be changed arbitrarily.

In the first to sixth embodiments, the holding ring 21 and the holding plates 31 may be fastened to the seal element 14 or the case 2 using fasteners other than the screws 25.

In the first to sixth embodiments, the material of the holding ring 21 and the holding plates 31 need not have elasticity. Furthermore, the holding ring 21 and the holding plates 31 may be formed integrally with the seal element 14.

In the first to sixth embodiments, the shape of the projections 24 need not be plate-like. For example, the projections 24 may be rod-like.

In the first embodiment, the seal element 14 may be eliminated as long as a relatively tight seal is maintained.

In the first to sixth embodiments, the lead wire hole 7 may be formed at sections other than the bottom wall 2a of the case 2, such as in the side walls of the case 2. Furthermore, the ports 17, 18 may also be provided at the side walls of the case 2.

In the first, second, and fourth to sixth embodiments, a liquid that does not affect the electric circuits and wiring may be sent into the space S1 as a cooling fluid as long as the space S1 remains tightly sealed.

In the first to sixth embodiments, a thermocouple for measuring temperatures may be embedded in the base plate 9. The thermocouple is used to measure the temperature of the hot plate 3 in order to adjust the values of the voltage or current supplied to the heating circuit accordingly and control the temperature. In this case, the lead wire of the thermocouple also extends from the case 2 through the packing 8.

In the first to sixth embodiments, the number of the intake ports 17 may be altered. A larger number of intake ports 17 speeds up the cooling of the hot plate 3 and cools the hot plate 3 in a more uniform manner. Furthermore, the number of discharge ports 18 may be three or more.

In the fourth embodiment, the intake ports 17 and the discharge ports 18 need not be located at the corners of right triangles and may be located at arbitrary positions.

In the fourth embodiment, the number of each of the ports 17, 18 may be only one in the same heat zone.

In the fourth embodiment, the number of heating circuits is not limited to three. In this case, one or more intake ports 17 need not be provided for each heating circuit as long as the total number of the intake ports 17 is 70 percent of the number of the heating circuits. For example, the number of the intake ports 17 may be seven or more if the number of the heating circuits is ten. If the number of the heating circuits is four, the number of the intake ports 17 may be three or more.

In the first to sixth embodiments, the circular hot plate 3 may be changed to a polygonal one. In this case, the shape of the lip 4, the seal element 14, the holding ring 21 (or the holding plates 31) are changed in accordance with the shape of the hot plate 3.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A hot plate unit comprising:

a case having a lip;

a hot plate having a heat generator, wherein the hot plate is made of sintered ceramic; and a holder for securing the hot plate to the case, wherein the holder contacts a a peripheral portion of the upper surface of the hot plate when the holder is fixed to the case;

wherein the holder includes a flat ring, wherein the ring has a diameter substantially equal to that of the lip;

wherein the holder includes a plurality of projections extending inwardly from the ring;

wherein the projections contact separate points on the periphery of the upper surface of the hot plate.

2. The hot plate unit according to claim 1, further comprising an annular attachment, wherein the hot plate is fixed to the lip via the annular attachment.

3. The hot plate unit according to claim 2, wherein a step is formed at an inner edge of the attachment for supporting the hot plate.

4. The hot plate unit according to claim 1, wherein the holder is plate-like and has at least one inwardly extending projection, wherein the holder has a hole for receiving a fastener.

5. The hot plate unit according to claim 2, wherein the holder includes an inwardly projecting potion that is bent toward a lower side of the holder.

6. The hot plate unit according to claim 1, wherein the flat ring is made of spring steel.

7. A hot plate unit comprising:

a case having a lip;

a hot plate having a heat generator, wherein the hot plate is made of sintered ceramic; and a holder for securing the hot plate to the case, wherein the holder contacts a peripheral portion of the upper surface of the hot plate when the holder is fixed to the case;

wherein the holder includes a plurality of holding plates, each holding plate having a length that is a fraction of the length of the lip.

8. The hot plate unit according to claim 7, further comprising an annular attachment, wherein the hot plate is fixed to the lip via the annular attachment.

9. The hot plate unit according to claim 8, wherein a step is formed at an inner edge of the attachment for supporting the hot plate.

10. The hot plate unit according to claim 7, wherein the holder is plate-like and has at least one inwardly extending projection, wherein the holder has a hole for receiving a fastener.

11. The hot plate unit according to claim 7, wherein the holder includes an inwardly projecting portion that is bent toward a lower side of the holder.

12. The hot plate unit according to claim 7, wherein the flat ring is made of spring steel.

* * * * *